US012750057B2

(12) United States Patent
Alvarez Fontecilla et al.

(10) Patent No.: US 12,750,057 B2
(45) Date of Patent: Sep. 29, 2026

(54) APPARATUS AND METHODS FOR NONLINEARITY CANCELLATION IN ELECTRONIC SYSTEMS

(71) Applicant: Analog Devices International Unlimited Company, County Limerick (IE)

(72) Inventors: Cristian Enrique Alvarez Fontecilla, Santiago (CL); Peter Delos, Greensboro, NC (US)

(73) Assignee: Analog Devices International Unlimited Company, County Limerick (IE)

( * ) Notice: Subject to any disclaimer, the term of this patent is extended or adjusted under 35 U.S.C. 154(b) by 0 days.

(21) Appl. No.: 18/938,586

(22) Filed: Nov. 6, 2024

(65) Prior Publication Data

US 2026/0128744 A1 May 7, 2026

(51) Int. Cl.
*H03K 19/0175* (2006.01)
*H03M 1/02* (2006.01)

(52) U.S. Cl.
CPC ...... *H03K 19/017509* (2013.01); *H03M 1/02* (2013.01)

(58) Field of Classification Search
None
See application file for complete search history.

(56) References Cited

U.S. PATENT DOCUMENTS 8,009,075 B2 * 8/2011 Currivan ............... H03M 1/188 341/158
12,519,226 B1 * 1/2026 Krishnasamy Maniam ................ H01Q 3/36
2014/0152477 A1 6/2014 Lewis et al.
2024/0241691 A1 * 7/2024 Shin .......................... G06F 5/01

OTHER PUBLICATIONS

Delos et al., “A Measurement Summary of Distributed Direct Sampling S-Band Receivers for Phased Arrays”, dated Feb. 10, 2022, available at https://www.analog.com/en/resources/technical-articles/a-measurement-summary-of-distributed-direct-sampling.html, 8 pages.
Delos et al., “Digital Arrays using Commercial Transceivers: Noise, Spurious, and Linearity Measurements,” 2019 IEEE International Symposium on Phased Array System & Technology (PAST), Waltham, MA, USA, 2019, pp. 1-5.

(Continued)

*Primary Examiner* — Cassandra F Cox
(74) *Attorney, Agent, or Firm* — Knobbe, Martens, Olson & Bear, LLP

(57) ABSTRACT

Apparatus and methods for nonlinearity cancellation in electronic systems are disclosed. In certain embodiments, an electronic system includes two or more circuit channels that process a common input signal in parallel and that each include at least one instantiation of a circuit that behaves nonlinearly. Thus, the nonlinear circuit is replicated and included at least once in each circuit channel. Each of the circuit channels has an input scaling factor and an output scaling factor that can vary from one circuit channel to another. The output signals from the circuit channels after (Continued)

scaling are combined to generate a combined output signal. The input and output scaling factors are selected to cancel or reduce nonlinearities.

20 Claims, 7 Drawing Sheets

(56) References Cited

OTHER PUBLICATIONS

Jones et al., “Novel All-Digital Beamforming Techniques for L/S/C-Band Multi-Channel Systems Leveraging Hardened DSP on Integrated Circuits,” 2022 IEEE International Symposium on Phased Array Systems & Technology (PAST), Waltham, MA, USA, 2022, pp. 1-8.
Talisa et al., “Benefits of Digital Phased Array Radars,” in Proceedings of the IEEE, vol. 104, No. 3, Mar. 2016, pp. 530-543.
Extended European Search Report, re European Patent Application No. 25 212 931.7, dated Mar. 26, 2026,12 pages.
Nguyen et al., “Advantages of High-Pass ΔΣ Modulators in Interleaved ΔΣ Analog to Digital Converter”, IEEE Xplore, vol. 1, dated Aug. 4, 2002, pp. 136-139.

* cited by examiner

APPARATUS AND METHODS FOR NONLINEARITY CANCELLATION IN ELECTRONIC SYSTEMS

FIELD OF THE DISCLOSURE

The disclosed technology relates generally to electronics, and more particularly to nonlinearity cancellation of circuit blocks.

BACKGROUND

Certain electrical circuits are desired to operate linearly, such that an output signal changes in a linear relationship with respect to an applied input signal. However, various nonidealities can result in the output signal exhibiting a nonlinear relationship with respect to the applied input signal. Such nonlinear behavior can arise from a wide variety of sources including, but not limited to, component mismatch, process variation, supply voltage constraints, changing temperature, signal amplitude saturation, and/or various other sources.

SUMMARY OF THE DISCLOSURE

Apparatus and methods for nonlinearity cancellation in electronic systems are disclosed. In certain embodiments, an electronic system includes two or more circuit channels that process a common input signal in parallel and that each include at least one instantiation of a circuit that behaves nonlinearly. Thus, the nonlinear circuit is replicated and included at least once in each circuit channel. Each of the circuit channels has an input scaling factor and an output scaling factor that can vary from one circuit channel to another. The output signals from the circuit channels after scaling are combined to generate a combined output signal. The input and output scaling factors are selected to cancel or reduce nonlinearities. Accordingly, by selecting suitable values of the input scaling factors and output scaling factors, nonlinear cancellation can be achieved. For example, the teachings herein can be used to cancel or reduce various nonlinearities including, but not limited to, third-order harmonic distortion. In contrast to calibration schemes which suffer from additive sequences and/or a convergence delay, the nonlinearity cancellation schemes herein can have relatively low complexity and/or high speed. The nonlinearity cancellation techniques can be applied to a wide variety of electronic systems, including, for example, data conversion systems and phased array antenna systems.

In one aspect, an electronic system includes two or more circuit channels configured to process an input signal in parallel to generate two or more output signals. The two or more circuit channels include a first circuit channel including a first circuit block configured to receive the input signal scaled by a first input scaling factor, the first circuit channel configured to generate a first output signal based on scaling an output of the first circuit block by a first output scaling factor. The two or more circuit channels further include a second circuit channel including a second circuit block configured to receive the input signal scaled by a second input scaling factor, the second circuit channel configured to generate a second output signal based on scaling an output of the second circuit block by a second output scaling factor, wherein the first circuit block and the second circuit block have a nonlinearity. The electronic system further includes an output combiner configured to combine the two or more output signals including the first output signal and the second output signal to generate a combined output signal in which the nonlinearity is canceled.

In another aspect, a method of nonlinearity cancellation includes processing an input signal in parallel using two or more circuit channels to generate two or more output signals. Processing the input signal includes scaling the input signal by a first input scaling factor to generate a first scaled input signal for a first circuit block of a first circuit channel, generating a first output signal based on scaling an output of the first circuit block by a first output scaling factor, scaling the input signal by a second input scaling factor to generate a second scaled input signal for a second circuit block of a second circuit channel, and generating a second output signal based on scaling an output of the second circuit block by a second output scaling factor. The first circuit block and the second circuit block have a nonlinearity, and the method further includes combining the two or more output signals including the first output signal and the second output signal using an output combiner to generate a combined output signal in which the nonlinearity is canceled.

DETAILED DESCRIPTION

Figure 1A:
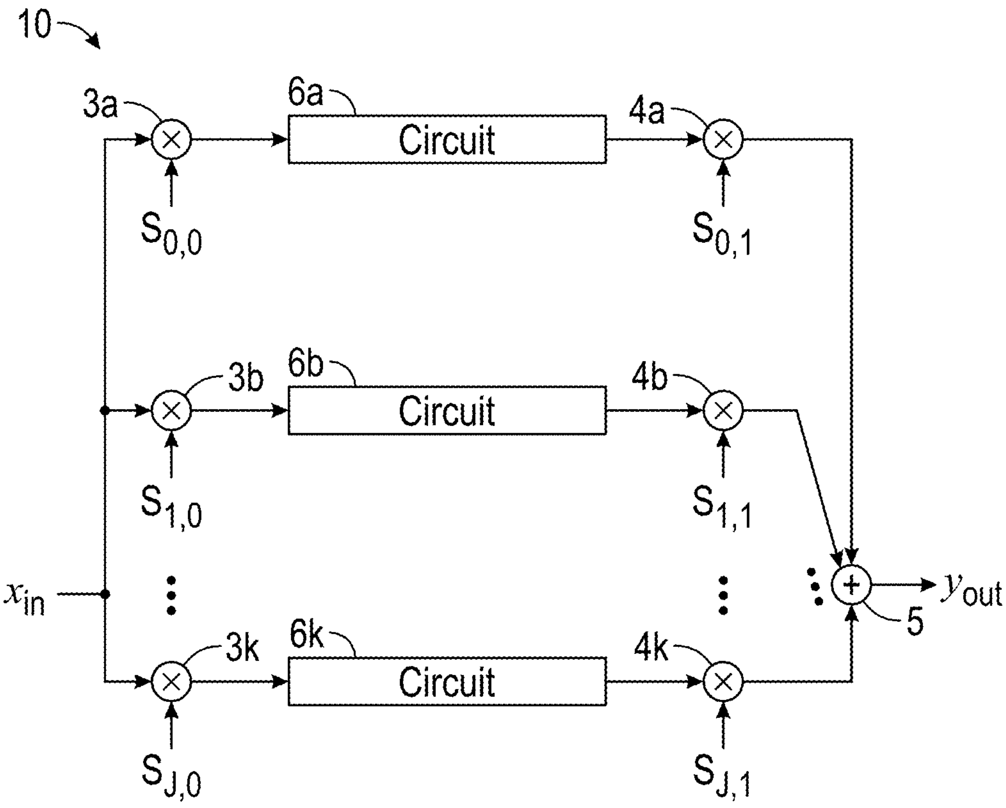
FIG. 1A is a schematic diagram of an electronic system according to one embodiment.

The following detailed description of embodiments presents various descriptions of specific embodiments of the invention. However, the invention can be embodied in a multitude of different ways. In this description, reference is made to drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for nonlinearity cancellation in electronic systems are disclosed. In certain embodiments, an electronic system includes two or more circuit channels that process a common input signal in parallel and that each include at least one instantiation of a circuit that behaves nonlinearly. Thus, the nonlinear circuit is replicated and included at least once in each circuit channel. Each of the circuit channels has an input scaling factor and an output scaling factor that can vary from one circuit channel to another. The output signals from the circuit channels after scaling are combined to generate a combined output signal. The input and output scaling factors are selected to cancel or reduce nonlinearities.

Accordingly, by selecting suitable values of the input scaling factors and output scaling factors, nonlinear cancellation can be achieved. For example, the teachings herein can be used to cancel or reduce various nonlinearities including, but not limited to, third-order nonlinearity such as third-order harmonic distortion.

In contrast to calibration schemes which suffer from additive sequences and/or a convergence delay, the nonlinearity cancellation schemes herein can have relatively low complexity and/or high speed.

The nonlinearity cancellation techniques can be applied to a wide variety of electronic systems, including, for example, data conversion systems. For instance, in some implementations, the circuit that behaves nonlinearly corresponds to an analog-to-digital converter (ADC) that is replicated and included in the circuit channels.

Another application of the teachings herein is to mitigate the effects of harmonic distortion in a phased array antenna system. For example, a phased array antenna system can include multiple transmit and/or receive channels for processing an input signal received from an antenna array. Although the number of receivers in a phased array system can be increased to boost array gain and improve noise and single-tone spurious performance, intermodulation products can remain correlated and thus not improve with array gain. Accordingly, nonlinearity such as intermodulation distortion can be an increasingly dominant performance concern in phased array systems. The teachings herein can be used in phased arrays and/or other electronic systems to cancel or reduce intermodulation distortion.

FIG. 1A is a schematic diagram of an electronic system 10 according to one embodiment. The electronic system 10 includes input modulators 3*a*, 3*b*, . . . 3*k*, circuit blocks 6*a*, 6*b*, . . . 6*k*, output modulators 4*a*, 4*b*, . . . 4*k*, and an output combiner 5.

In the illustrated embodiment, the electronic system 10 includes J+1 circuit channels, where J is an integer greater than or equal to 1. Each circuit channel includes a corresponding input modulator, circuit block, and output modulator. Additionally, each of the circuit blocks 6*a*, 6*b*, . . . 6*k* are replicas of one another, and can correspond to a circuit that ideally has a linear relationship. However, due to various nonidealities, the circuit blocks 6*a*, 6*b*, . . . 6*k* exhibit nonlinear characteristics.

As shown in FIG. 1A, the electronic system 10 includes an input that receives an input signal $x_{in}$, which in certain implementations is an analog or radio frequency (RF) signal. The input signal $x_{in}$ is provided to each of the input modulators 3*a*, 3*b*, . . . 3*k*, which scale the input signal $x_{in}$ by input scaling factors $S_{0,0}$, $S_{1,0}$ . . . $S_{J,0}$, respectively. The input scaling factors $S_{0,0}$, $S_{1,0}$ . . . $S_{J,0}$ are also referred to herein as modulation factors.

With continuing reference to FIG. 1A, the scaled input signals are provided to the circuit blocks 6*a*, 6*b*, . . . 6*k*, which can correspond to a wide variety of types of electronic circuits including, but not limited to, ADCs. The circuit blocks 6*a*, 6*b*, . . . 6*k* generate output signals that are provided to the output modulators 4*a*, 4*b*, . . . 4*k*, which scale the output signals by output scaling factors $S_{0,1}$, $S_{1,1}$ . . . $S_{J,1}$, respectively. The output scaling factors $S_{0,1}$, $S_{1,1}$ . . . $S_{J,1}$, are also referred to herein as demodulation factors.

As shown in FIG. 1A, the scaled output signals are combined by the output combiner 5 to generate a combined output signal $y_{out}$ at an output.

In the illustrated embodiment, the circuit blocks 6*a*, 6*b*, . . . 6*k* correspond to replicas of one another and process the same input signal $x_{in}$ in parallel but with different input scaling factors. Although the transfer function of the circuit blocks 6*a*, 6*b*, . . . 6*k* behaves nonlinearly, the values of the input scaling factors $S_{0,0}$, $S_{1,0}$ . . . $S_{J,0}$ and the output scaling factors $S_{0,1}$, $S_{1,1}$ . . . $S_{J,1}$ can be selected to cancel or otherwise reduce nonlinearities. For example, by appropriate selection of the scaling factors, the combined output signal $y_{out}$ can have an improved linear relationship with respect to the input signal $x_{in}$ even though each of the circuit blocks 6*a*, 6*b*, . . . 6*k* has a nonlinear transfer function. Accordingly, appropriate selection of the scaling factors results in one or more nonlinearities being canceled from the combined output signal $y_{out}$.

Selection of suitable scaling factors to achieve nonlinearity cancellation will be discussed in detail further below with reference to the examples of FIGS. 3A-3B.

Figure 1B:
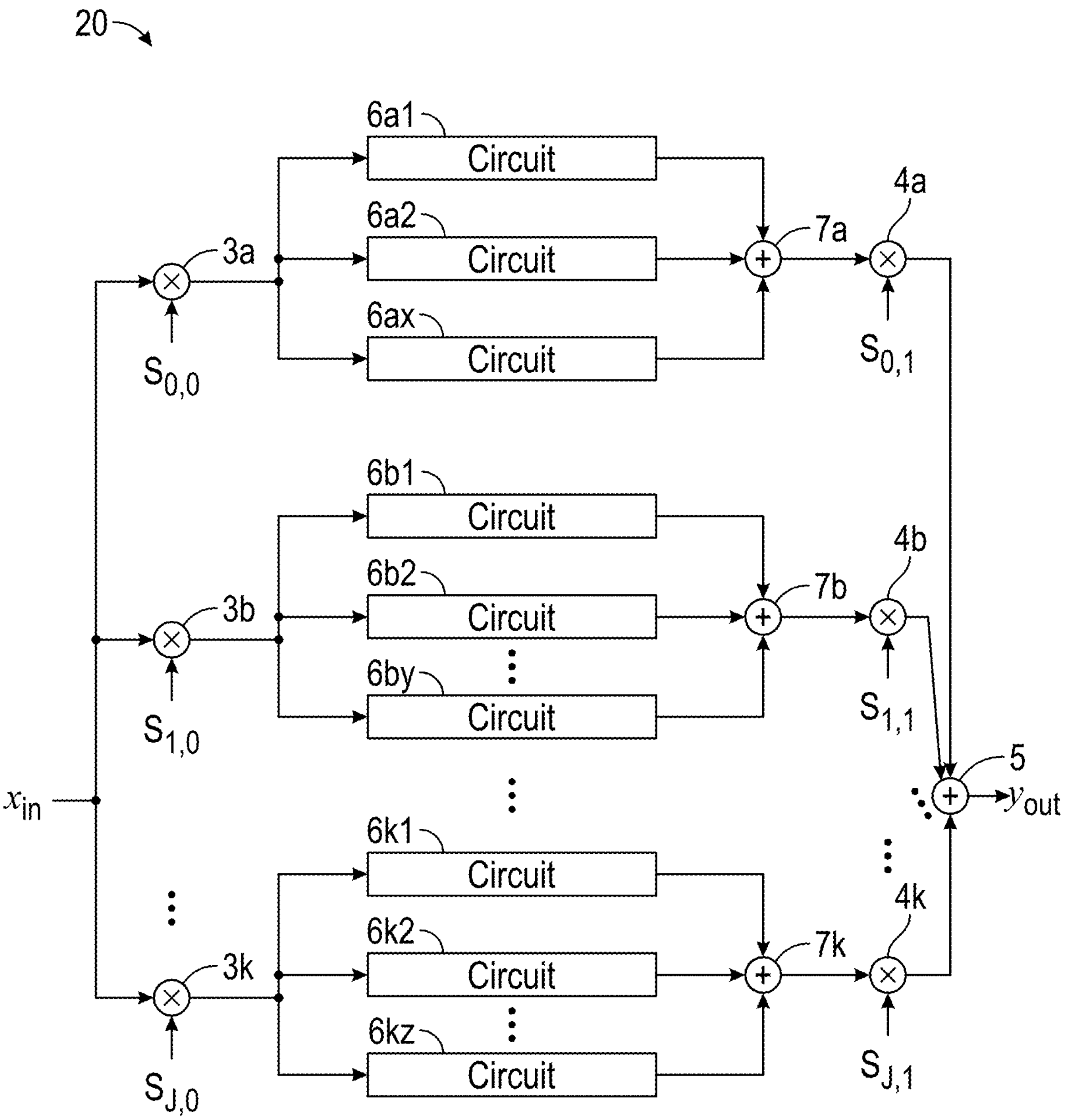
FIG. 1B is a schematic diagram of an electronic system according to another embodiment.

FIG. 1B is a schematic diagram of an electronic system 20 according to another embodiment. The electronic system 20 includes input modulators 3*a*, 3*b*, . . . 3*k*, circuit blocks 6*a*1, 6*a*2, . . . 6*ax*, 6*b*1, 6*b*2, . . . 6*by*, . . . 6*k*1, 6*k*2, . . . 6*kz*, combiners 7*a*, 7*b*, . . . 7*k*, output modulators 4*a*, 4*b*, . . . 4*k*, and an output combiner 5. The values of x, y, and z and the corresponding number of circuit blocks can be selected to be any positive integer values desired for a particular application. The values of x, y, and z can be the same or different, depending on implementation. The values of x, y, and z are also referred to as the number of subchannels associated with each of the channels.

The electronic system 20 of FIG. 1B is similar to the electronic system 10 of FIG. 1A, except that the electronic system 20 of FIG. 1B includes multiple circuit blocks that are placed in parallel in each circuit channel and scaled by the same input scaling factor and output scaling factor. For example, the electronic system 20 of FIG. 1B includes J+1 circuit channels, with each circuit channel including multiple copies of the nonlinear circuit block in parallel to operate as subchannels.

For example, in the embodiment of FIG. 1B, the circuit blocks 6*a*1, 6*a*2, . . . 6*ax* are each scaled by a scaling factor $S_{0,0}$ using the input modulator 3*a*. Additionally, the output signals from the circuit blocks 6*a*1, 6*a*2, . . . 6*ax* are combined using the combiner 7*a* and thereafter scaled by a scaling factor $S_{0,1}$ using the output modulator 4*a*. Similarly, the circuit blocks 6*b*1, 6*b*2, . . . 6*by* are each scaled by a scaling factor $S_{1,0}$ using the input modulator 3*b*. The output signals from the circuit blocks 6*b*1, 6*b*2, . . . 6*by* are combined using the combiner 7*b* and thereafter scaled by a scaling factor $S_{1,1}$ using the output modulator 4*b*. Furthermore, the circuit blocks 6*k*1, 6*k*2, . . . 6*kz* are each scaled by a scaling factor $S_{J,0}$ using the input modulator 3*k*. The output signals from the circuit blocks 6*k*1, 6*k*2, . . . 6*kz* are combined using the combiner 7*k* and thereafter scaled by a scaling factor $S_{J,1}$ using the output modulator 4*k*.

By including multiple circuit blocks in parallel and scaled using the same scaling factors, the noise per channel can be reduced. Furthermore, parallelizing the circuit blocks in this manner can change the path gain and therefore change the scaling factors needed to achieve nonlinearity cancellation. Thus, the number of circuit blocks in parallel for each circuit channel can be strategically selected based on constraints on noise and/or desired scaling factors associated with a particular application.

Any of the embodiments herein can include one or more circuit channels in which nonlinear circuit blocks are connected in parallel.

Figure 2:
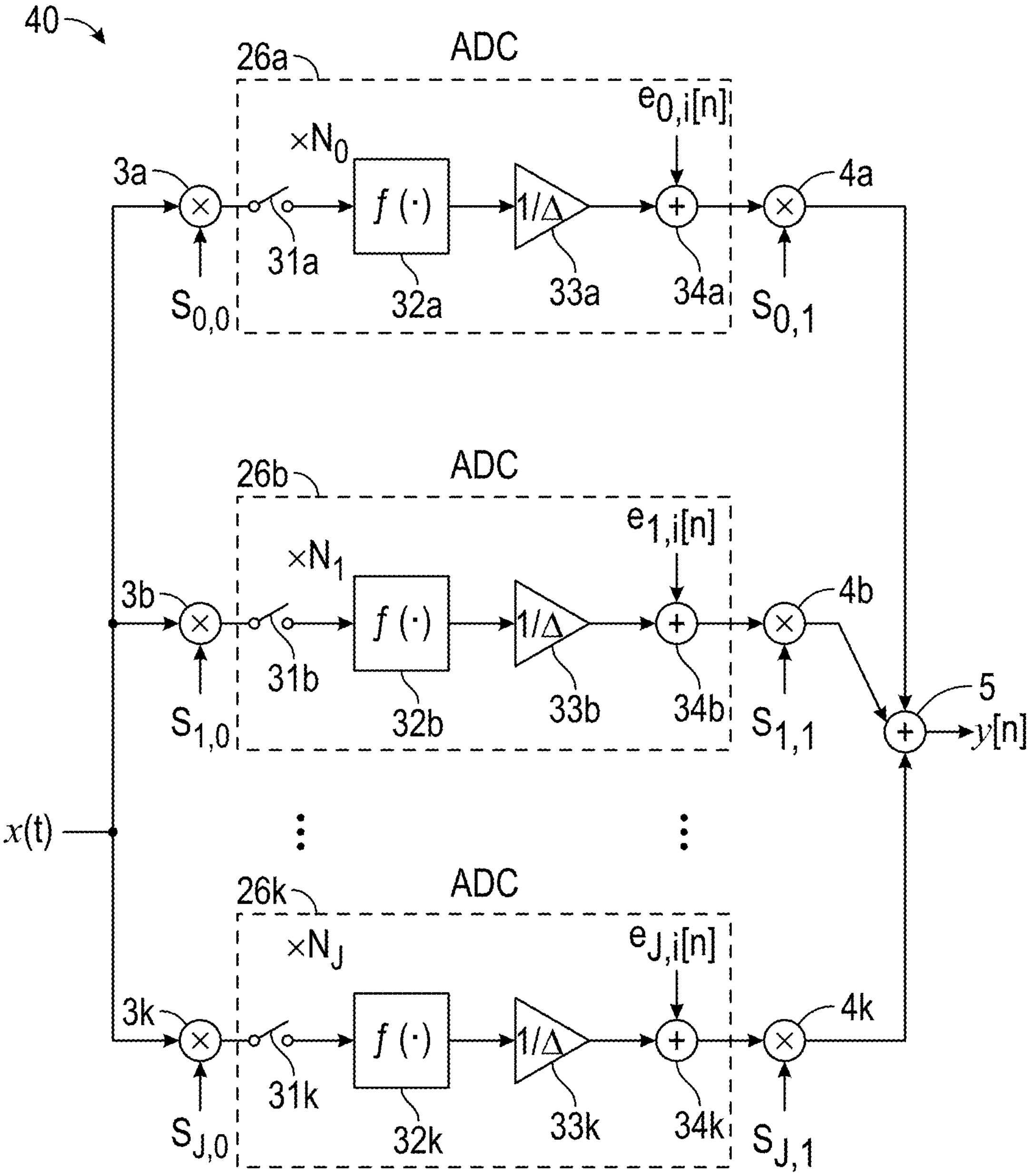
FIG. 2 is a schematic diagram of a data conversion system according to one embodiment.

FIG. 2 is a schematic diagram of a data conversion system 40 according to one embodiment. The data conversion system 40 includes input modulators 3$a$, 3$b$, . . . 3$k$, ADCs 26$a$, 26$b$, . . . 26$k$, output modulators 4$a$, 4$b$, . . . 4$k$, and an output combiner 5.

The data conversion system 40 of FIG. 2 is similar to the electronic system 10 of FIG. 1A, except that the data conversion system 40 of FIG. 2 implements the electronic circuits 6$a$, 6$b$, . . . 6$k$ of FIG. 1A as ADCs 26$a$, 26$b$, . . . 26$k$. Thus, each circuit channel includes an ADC, in this embodiment.

The ADCs 26$a$, 26$b$, . . . 26$k$ operate in parallel with one another to process an analog input signal x(t) to generate a digital output signal y[n]. The ADCs 26$a$, 26$b$, . . . 26$k$ are associated with any desired number of parallel subchannels $N_0$, $N_1$, . . . $N_J$, respectively. The ADCs 26$a$, 26$b$, . . . 26$k$ are modeled using switches 31$a$, 31$b$, . . . 31$k$, transfer functions 32$a$, 32$b$, . . . 32$k$, delta scale factors 33$a$, 33$b$, . . . 33$k$, and additive error sources 34$a$, 34$b$, . . . 34$k$. Additionally, the delta scale factors 33$a$, 33$b$, . . . 33$k$ provide 1/Δ scaling, while the additive error sources 34$a$, 34$b$, 34$k$ provide additive noise $e_{0,1}[n]$, $e_{1,i}[n]$, . . . $e_{J,i}[n]$, respectively. The delta scale factors 33$a$, 33$b$, . . . 33$k$ and the additive error sources 34$a$, 34$b$, 34$k$ collectively represent quantizers of the ADCs 26$a$, 26$b$, . . . 26$k$, respectively.

The transfer functions 32$a$, 32$b$, . . . 32$k$ of FIG. 2 can be represented as $f(w)=w+a_2w^2+a_3w^3+\ldots$, and the harmonic distortion (HD) components desired to be canceled can correspond to $HDp_0$, . . . $HDp_{J-1}$, where $p_0$, . . . $p_{J-1}$ are integers greater than 1. Additionally, the output signal y[n] of the data conversion system 40 can be represented using Equation 1 below.

$$
\begin{aligned}
y[n] = {} & \frac{1}{\Delta}x[n](N_0S_{0,0}S_{0,1}+\ldots+N_JS_{J,0}S_{J,1})+ \\
& \frac{a_2}{\Delta}x^2[n]\left(N_0S_{0,0}^2S_{0,1}+\ldots+N_JS_{J,0}^2S_{J,1}\right)+ \\
& \frac{a_3}{\Delta}x^3[n]\left(N_0S_{0,0}^3S_{0,1}+\ldots+N_JS_{J,0}^3S_{J,1}\right)+\ldots+ \\
& S_{0,1}\sum_{i=0}^{N_0-1}e_{0,i}[n]+S_{1,1}\sum_{i=0}^{N_1-1}e_{1,i}[n]+\ldots+S_{J,1}\sum_{i=0}^{N_J-1}e_{J,i}[n]
\end{aligned}
\tag{Equation 1}
$$

The expression above for Equation 1 can be more compactly written using Equation 2 below.

$$
y[n] = \frac{1}{\Delta}\sum_{p=1}^{\infty}a_px^p[n]\left(N_0S_{0,0}^pS_{0,1}+\ldots+N_JS_{J,0}^pS_{J,1}\right)+\sum_{j=0}^{J}\sum_{i=0}^{N_j-1}S_{j,1}e_{j,i}[n]
\tag{Equation 2}
$$

In Equation 2, the term $$
\left(N_0S_{0,0}^pS_{0,1}+\ldots+N_JS_{J,0}^pS_{J,1}\right)
$$

is desired to be 1 for p=1 and 0 for $p=p_0$, . . . $p_{J-1}$. This can be expressed using Equation 3 below, where a matrix S is defined.

$$
\underbrace{\begin{bmatrix} S_{0,0} & S_{1,0} & \cdots & S_{J,0} \\ S_{0,0}^{p_0} & S_{1,0}^{p_0} & \cdots & S_{J,0}^{p_0} \\ \vdots & \vdots & \ddots & \vdots \\ S_{0,0}^{p_{J-1}} & S_{1,0}^{p_{J-1}} & \cdots & S_{J,0}^{p_{J-1}} \end{bmatrix}}_{\triangleq S}
\begin{bmatrix} N_0S_{0,1} \\ N_1S_{1,1} \\ \vdots \\ N_JS_{J,1} \end{bmatrix}
=
\begin{bmatrix} 1 \\ 0 \\ \vdots \\ 0 \end{bmatrix}
\tag{Equation 3}
$$

Accordingly, arbitrary values of the input scaling factors $S_{0,0}$, $S_{1,0}$ . . . $S_{J,0}$ can be selected so long as the matrix S is invertible. Additionally, the output scaling factors $S_{0,1}$, $S_{1,1}$ . . . $S_{J,1}$ for nonlinearity cancellation can be expressed using Equation 4 below.

$$
\begin{bmatrix} N_0S_{0,1} \\ N_1S_{1,1} \\ \vdots \\ N_JS_{J,1} \end{bmatrix}
= S^{-1}
\begin{bmatrix} 1 \\ 0 \\ \vdots \\ 0 \end{bmatrix}
\tag{Equation 4}
$$

With continuing reference to FIG. 2, the scaling factors can be selected to achieve cancellation of unwanted harmonic distortion components.

In certain embodiments, J+1 circuit channels are used to cancel J harmonic distortion components.

For instance, in a first example, two circuit channels (for instance, each including an ADC) are used to cancel third-order harmonic distortion ($HD_3$).

In a second example, three circuit channels are used to cancel both second-order harmonic distortion ($HD_2$) and $HD_3$.

In a third example, three circuit channels are used to cancel both $HD_3$ and fifth-order harmonic distortion ($HD_5$).

In a fourth example, four circuit channels are used, with $S_{0,0}=1$, $S_{0,1}=1$, $S_{1,0}=-1$ and $S_{1,1}=-1$, $S_{2,0}=i$ and $S_{2,1}=-i$, $S_{3,0}=-i$ and $S_{3,1}=i$. Implementing the coefficients in this manner can cancel all HD components except the 5th, the 9th, the 13th, etc. In this example, the coefficients for nonlinearity cancellation include complex numbers.

Figure 3A:
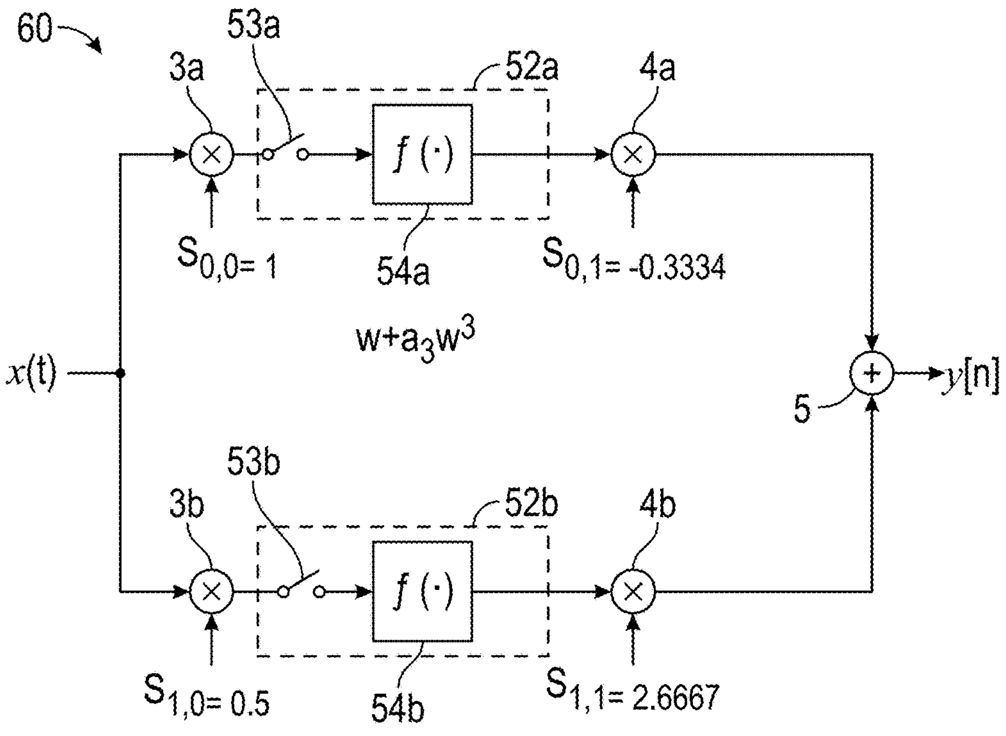
FIG. 3A is a schematic diagram of a data conversion system according to another embodiment.

FIG. 3A is a schematic diagram of a data conversion system 60 according to another embodiment. The data conversion system 60 includes a first input modulator 3$a$, a second input modulator 3$b$, a first data conversion channel 52$a$, a second data conversion channel 52$b$, a first output modulator 4$a$, a second output modulator 4$b$, and an output combiner 5$b$. The first data conversion channel 52$a$ includes a first ADC represented by a switch 53$a$ and a transfer function 54$a$, while the second data conversion channel 52$b$ includes a second ADC represented by a switch 53$b$ and a transfer function 54$b$.

As shown in FIG. 3A, the first input modulator 3$a$ provides a scaling factor $S_{0,0}$, while the second input modulator 3$b$ provides a scaling factor $S_{1,0}$. Additionally, the first output modulator 4$a$ provides a scaling factor $S_{0,1}$, while the second output modulator 4$b$ provides a scaling factor $S_{1,1}$.

In the illustrated embodiment, the transfer functions 54$a$/54$b$ are represented as $w+a_3w^3$, and the input and output scaling factors are selected to achieve cancellation of $HD_3$. For example, the output signal y[n] can be given by Equation 5 below.

$$
y[n] = x[n](S_{0,0}S_{0,1}+S_{1,0}S_{1,1})+a_3x^3[n]\left(S_{0,0}^3S_{0,1}+S_{1,0}^3S_{1,1}\right)
\tag{Equation 5}
$$

To achieve cancellation of $HD_3$, the Equation 6 can be solved.

$$S_{0,0}S_{0,1} + S_{1,0}S_{1,1} = 1$$
$$S_{0,0}^3S_{0,1} + S_{1,0}^3S_{1,1} = 0 \quad \text{Equation 6}$$

The expression of Equation 6 can be represented in matrix form using Equation 7 below, where a matrix S is defined.

$$\underbrace{\begin{bmatrix} S_{0,0} & S_{1,0} \\ S_{0,0}^3 & S_{1,0}^3 \end{bmatrix}}_{\triangleq S}\begin{bmatrix} S_{0,1} \\ S_{1,1} \end{bmatrix} = \begin{bmatrix} 1 \\ 0 \end{bmatrix} \quad \text{Equation 7}$$

With continuing reference to FIG. 3A, the values of the output scaling factors $S_{0,1}$ and $S_{1,1}$ can be found by solving Equation 8 below. The values of the input scaling factors $S_{0,0}$ and $S_{1,0}$ can be selected to be any values, so long as the matrix S is invertible.

$$\begin{bmatrix} S_{0,1} \\ S_{1,1} \end{bmatrix} = S^{-1}\begin{bmatrix} 1 \\ 0 \end{bmatrix} \quad \text{Equation 8}$$

For example, when the input scaling factors $S_{0,0}=1$ and $S_{1,0}=0.5$, then the values of the output scaling factors to achieve $HD_3$ cancellation correspond to $S_{0,1}=-0.3334$ and $S_{1,1}=2.6667$, as annotated in FIG. 3A. In another example, when the input scaling factors $S_{0,0}=1$ and $S_{1,0}=-1.5$, then the values of the output scaling factors to achieve $HD_3$ cancellation correspond to $S_{0,1}=1.8$ and $S_{1,1}=0.5334$.

Accordingly, the selection of the input scaling factors and/or the number of circuit channels can be selected such the matrix S is invertible (for example, having a condition number less than a threshold). Further, the selection of the input scaling factors can be made to provide output scaling factors of desired values for nonlinearity cancellation. For example, certain scaling factors can be more suitable for implementation in an electronic system due to circuit design considerations and/or other factors.

Figure 3B:
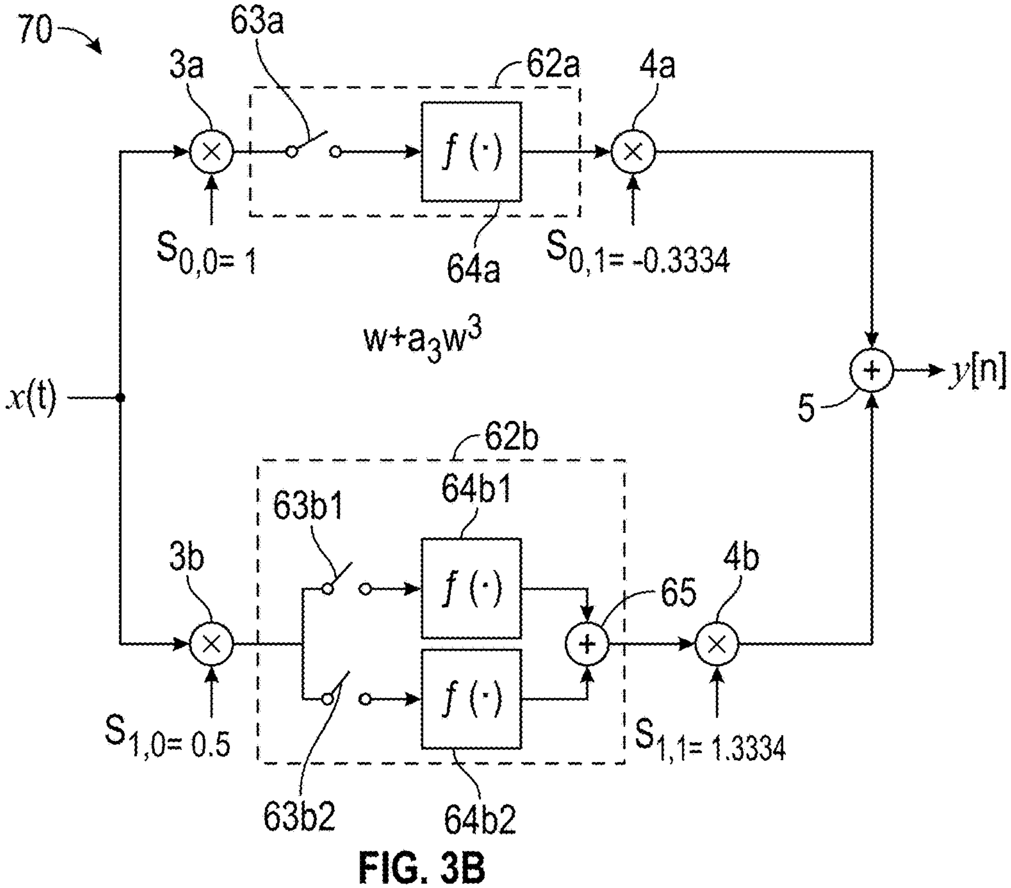
FIG. 3B is a schematic diagram of a data conversion system according to another embodiment.

FIG. 3B is a schematic diagram of a data conversion system 70 according to another embodiment. The data conversion system 70 includes a first input modulator 3*a*, a second input modulator 3*b*, a first data conversion channel 62*a*, a second data conversion channel 62*b*, a first output modulator 4*a*, a second output modulator 4*b*, and an output combiner 5*b*. The first data conversion channel 62*a* includes a first ADC represented by a switch 63*a* and a transfer function 64*a*, while the second data conversion channel 52*b* includes a second ADC and a third ADC in parallel. The second ADC is represented by a switch 63*b*1 and a transfer function 64*b*1, while the third ADC is represented by a switch 63*b*2 and a transfer function 64*b*2. The output of the second ADC and the third ADC are combined using combiner 65.

The data conversion system 70 of FIG. 3B is similar to the data conversion system 60 of FIG. 3A, except that the data conversion system 70 implements the second data conversion channel 62*b* using two parallel ADCs.

By implementing the second data conversion channel in this manner, the transfer function of the data conversion system 70 is changed, which results in a different selection of scaling factors to achieve $HD_3$ cancellation.

For example, when representing the transfer functions 64*a*/64*b* as $w+a_3w^3$, the output signal y[n] can be given by Equation 9 below.

$$y[n] = x[n](S_{0,0}S_{0,1} + 2S_{1,0}S_{1,1}) + a_3x^3[n](S_{0,0}^3S_{0,1} + 2S_{1,0}^3S_{1,1}) \quad \text{Equation 9}$$

To achieve $HD_3$ cancellation, the scaling factors can be selected in accordance with Equation 10 below.

$$S_{0,0}S_{0,1} + 2S_{1,0}S_{1,1} = 1$$
$$S_{0,0}^3S_{0,1} + 2S_{1,0}^3S_{1,1} = 0 \quad \text{Equation 10}$$

The expression of Equation 10 can be represented in matrix form using Equation 11, which defines a matrix S.

$$\underbrace{\begin{bmatrix} S_{0,0} & S_{1,0} \\ S_{0,0}^3 & S_{1,0}^3 \end{bmatrix}}_{\triangleq S}\begin{bmatrix} S_{0,1} \\ 2S_{1,1} \end{bmatrix} = \begin{bmatrix} 1 \\ 0 \end{bmatrix} \quad \text{Equation 11}$$

The values of the output scaling factors $S_{0,1}$ and $S_{1,1}$ can be found by solving Equation 12 below. The values of the input scaling factors $S_{0,0}$ and $S_{1,0}$ can be selected to be any values, so long as the matrix S is invertible.

$$\begin{bmatrix} S_{0,1} \\ 2S_{1,1} \end{bmatrix} = S^{-1}\begin{bmatrix} 1 \\ 0 \end{bmatrix} \quad \text{Equation 12}$$

For example, when the input scaling factors $S_{0,0}=1$ and $S_{1,0}=0.5$, then the values of the output scaling factors to achieve $HD_3$ cancellation correspond to $S_{0,1}=-0.3334$ and $S_{1,1}=1.3334$, as annotated in FIG. 3B.

As shown by a comparison of the example scaling factors annotated in 3A and FIG. 3B, the scaling factors for $HD_3$ cancellation can change when circuit blocks are placed in parallel for a given circuit channel. Thus, parallelization of circuit blocks, such as ADCs, is an effective technique to achieve output scaling factors desired for a particular application. Further, placing the circuit blocks in parallel can achieve a reduction in noise.

Figure 4:
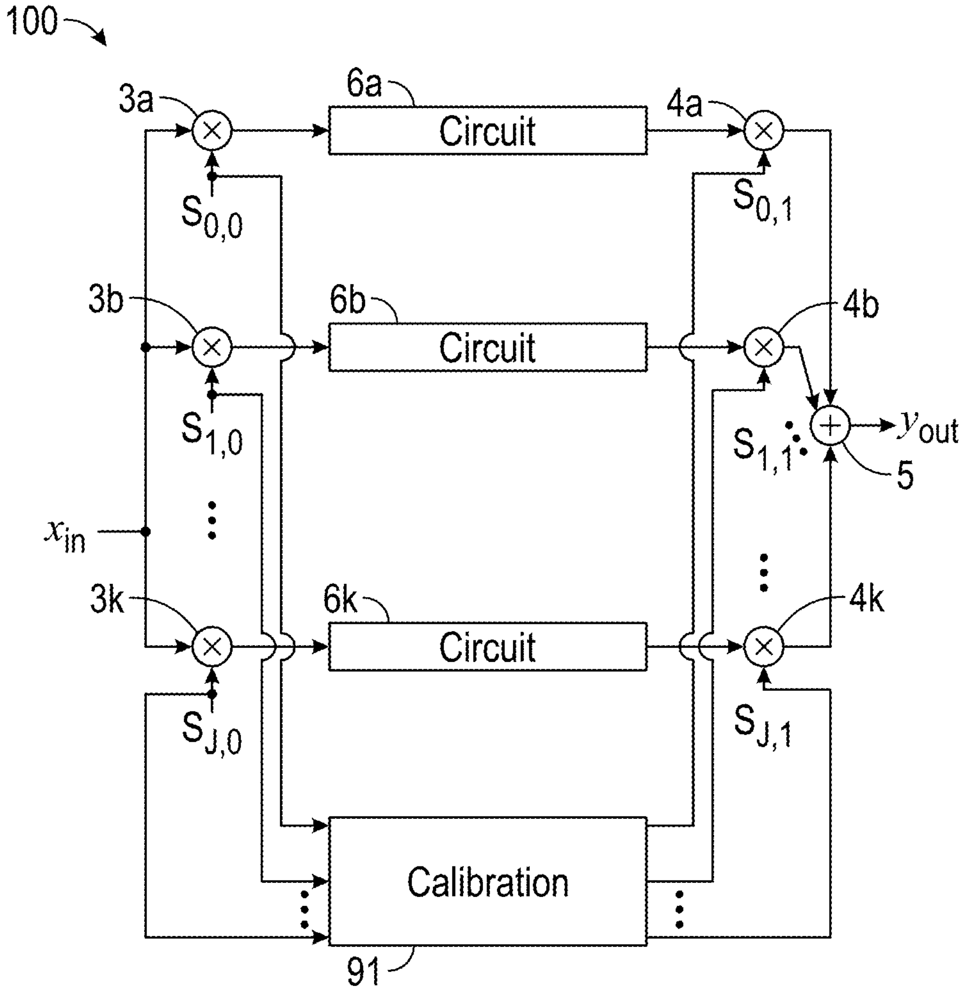
FIG. 4 is a schematic diagram of an electronic system according to another embodiment.

FIG. 4 is a schematic diagram of an electronic system 100 according to another embodiment. The electronic system 100 includes input modulators 3*a*, 3*b*, . . . 3*k*, circuit blocks 6*a*, 6*b*, . . . 6*k*, output modulators 4*a*, 4*b*, . . . 4*k*, an output combiner 5, and a calibration circuit 91.

The electronic system 100 of FIG. 4 is similar to the electronic system 10 of FIG. 1, except that the electronic system 100 further includes the calibration circuit 91.

In the illustrated embodiment, the calibration circuit 91 detects the values of input scaling factors $S_{0,0}$, $S_{1,0}$ . . . $S_{J,0}$ including any variation in the input scaling factors arising from process, temperature, and/or voltage (PVT) variation. Additionally, the detected input scaling factors are used to generate output scaling factors $S_{0,1}$, $S_{1,1}$ . . . $S_{J,1}$, which are calibrated to account for the PVT variation.

Figure 5A:
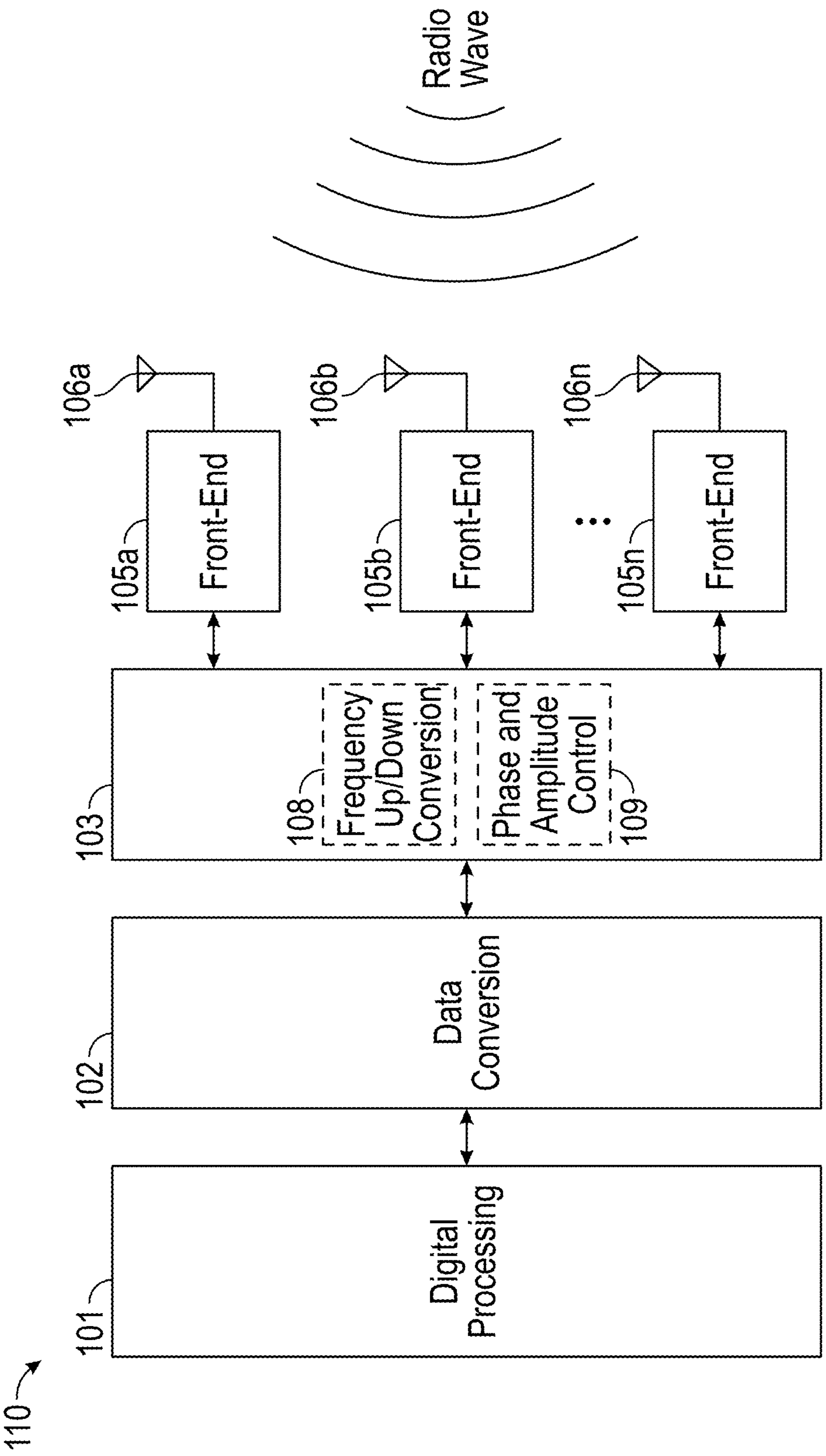
FIG. 5A is a schematic diagram of one embodiment of a phased array antenna system.

FIG. 5A is a schematic diagram of one embodiment of a phased array antenna system 110. The phased array antenna system 110 includes a digital processing circuit 101, a data conversion circuit 102, a transceiver 103, RF front ends 105*a*, 105*b*, . . . 105*n*, and an antenna array including antennas 106_a_, 106_b_, . . . 106_n_. Although an example system with three RF front ends and three antennas is illustrated, the phased array antenna system 110 can include more or fewer RF front ends and/or more or fewer antennas as indicated by the ellipses. Furthermore, in certain implementations, the phased array antenna system 110 is implemented with separate antennas for transmitting and receiving signals.

The phased array antenna system 110 illustrates one embodiment of an electronic system that can be implemented with nonlinearity cancellation in accordance with the teachings herein. For example, although the number of receivers in a phased array system can be increased to boost array gain and improve noise and single-tone spurious performance, intermodulation products can remain correlated and thus not improve with array gain. Accordingly, nonlinearity such as intermodulation distortion can be an increasingly dominant performance concern in phased array systems. The teachings herein can be used in such a phased array antenna system to cancel or reduce nonlinearities including, but not limited to, $HD_3$.

Although nonlinearity cancellation can be applied to phased array antenna system 110, the nonlinearity cancellation schemes disclosed herein can be used in a wide range of electronics. A phased array antenna system is also referred to herein as an active scanned electronically steered array or beamforming communication system.

As shown in FIG. 5A, the transceiver 103 is coupled to antennas 106_a_, 106_b_, . . . 106_n_ through RF front ends 105_a_, 105_b_, . . . 105_n_, respectively. The transceiver 103 includes a frequency up/down conversion circuit 108 and a phase and amplitude control circuit 109, in this embodiment. The transceiver 103 provides RF signal processing of RF signals transmitted and received. In the illustrated embodiment, each communication channel is associated with a corresponding RF front end and antenna. However, other implementations are possible.

With continuing reference to FIG. 5A, the digital processing circuit 101 generates digital transmit data for controlling a transmit beam radiated from the antennas 106_a_, 106_b_, . . . 106_n_. The digital processing circuit 101 also processes digital receive data representing a receive beam received by the antennas 106_a_, 106_b_, . . . 106_n_ in response to a received radio wave. In certain implementations, the digital processing circuit 101 includes one or more baseband processors.

As shown in FIG. 5A, the digital processing circuit 101 is coupled to the data conversion circuit 102, which can include digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 108 provides frequency upshifting from baseband to RF and frequency downshifting from RF to baseband, in this embodiment. However, other implementations are possible, such as configurations in which the phased array antenna system 110 operates in part at an intermediate frequency (IF) or in which RF data converters provide direct conversion between digital and RF.

The transceiver 103 also includes the phase and/or amplitude control circuit 109 for controlling gain and phase for beamforming and/or other desired functions, in this embodiment. However other implementations are possible. For example, beamforming can be implemented in all or part in the digital domain (for instance, in the digital processing circuit 101).

With respect to signal transmission, the RF signals radiated from the antennas 106_a_, 106_b_, . . . 106_n_ aggregate through constructive and destructive interference to collectively generate a transmit beam having a particular direction. With respect to signal reception, a receive beam is generated by combining the RF signals received from the antennas 106_a_, 106_b_, . . . 106_n_ after amplitude scaling and/or phase shifting.

Phased array antenna systems are used in a wide variety of applications including, but not limited to, mobile communications, military and defense systems, and/or radar technology.

Figure 5B:
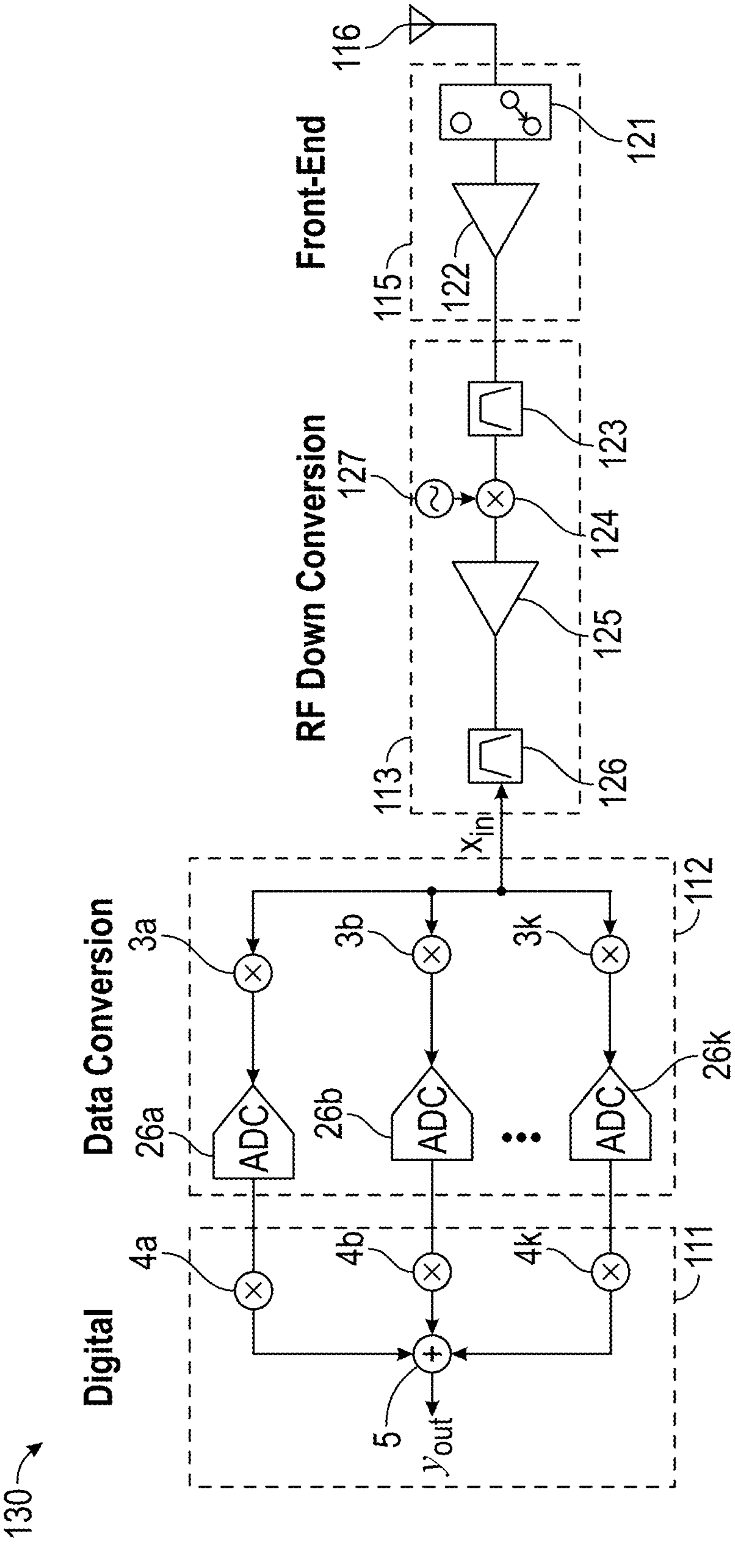
FIG. 5B is a schematic diagram of one embodiment of a receive slice for the phased array antenna system of FIG. 5A.

FIG. 5B is a schematic diagram of one embodiment of a receive slice 130 for the phased array antenna system 110 of FIG. 5A. The receive slice 130 is coupled to an antenna 116, and includes a digital processing circuit 111, a data conversion circuit 112, an RF downconversion circuit 113, and a front-end 115.

In the illustrated embodiment, the front-end system includes a low noise amplifier 122 and a transmit/receive switch 121 for selectively connecting an input of the low noise amplifier 122 to the antenna 116. The RF downconversion circuit 113 includes an input filter 123, a downconverting mixer 124, a receive amplifier 125, an output filter 126, and a local oscillator 127. The input filter 123 is coupled to an output of the low noise amplifier 122, and generates a filtered RF receive signal that is provided to the downconverting mixer 124. The downconverting mixer 124 downconverts the filtered RF receive signal using a local oscillator clock signal from the local oscillator 127 to generate a downconverted receive signal. The downconverted receive signal is amplified by the receive amplifier 125 and filtered by the output filter 126 to generate an input signal $x_{in}$ for the data conversion circuit 112.

With continuing reference to FIG. 5B, the conversion circuit 112 is implemented using input modulators 3_a_, 3_b_, . . . 3_k_ for scaling the input signal $x_{in}$ provided to ADCs 26_a_, 26_b_, . . . 26_k_. Additionally, the digital processing circuit 111 includes output modulators 4_a_, 4_b_, . . . 4_k_ for scaling the output signals from each of the ADCs 26_a_, 26_b_, . . . 26_k_, respectively, and a combiner 5 for combing the scaled output signals to generate an output signal $y_{out}$.

By selecting suitable scaling factors, nonlinear components (for instance, $HD_3$ or other harmonic distortion components) can be reduced or eliminated from the output signal $y_{out}$.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An electronic system comprising:

two or more circuit channels configured to process an input signal in parallel to generate two or more output signals, wherein the two or more circuit channels comprise:

a first circuit channel including a first circuit block configured to receive the input signal scaled by a first input scaling factor, the first circuit channel configured to generate a first output signal based on scaling an output of the first circuit block by a first output scaling factor; and a second circuit channel including a second circuit block configured to receive the input signal scaled by a second input scaling factor, the second circuit channel configured to generate a second output signal based on scaling an output of the second circuit block by a second output scaling factor, wherein the first circuit block and the second circuit block have a nonlinearity; and an output combiner configured to combine the two or more output signals including the first output signal and the second output signal to generate a combined output signal in which the nonlinearity is canceled, wherein the nonlinearity is a harmonic distortion component.

2. The electronic system of claim 1, wherein the two or more circuit channels further comprise:

a third circuit channel including a third circuit block configured to receive the input signal scaled by a third input scaling factor, the third circuit channel configured to generate a third output signal of the two or more output signals based on scaling an output of the third circuit block by a third output scaling factor.

3. The electronic system of claim 1, wherein the first circuit block is a first analog-to-digital converter (ADC) and the second circuit block is a second ADC.

4. The electronic system of claim 3, wherein the input signal is an analog or radio frequency signal and the combined output signal is a digital signal.

5. The electronic system of claim 1, wherein a plurality of input scaling factors including the first input scaling factor and the second input scaling factor define a matrix, and wherein a plurality of output scaling factors including the first output scaling factor and the second output scaling factor are based on an inverse of the matrix.

6. The electronic system of claim 1, further comprising a calibration circuit configured to calibrate the first output scaling factor based on a detected value of the first input scaling factor, and to calibrate the second output scaling factor based on a detected value of the second input scaling factor.

7. The electronic system of claim 1, wherein the second circuit block is a replica of the first circuit block.

8. The electronic system of claim 1, implemented in a phased array antenna.

9. An electronic system comprising:

two or more circuit channels configured to process an input signal in parallel to generate two or more output signals, wherein the two or more circuit channels comprise:

a first circuit channel including a first circuit block configured to receive the input signal scaled by a first input scaling factor, the first circuit channel configured to generate a first output signal based on scaling an output of the first circuit block by a first output scaling factor; and a second circuit channel including a second circuit block configured to receive the input signal scaled by a second input scaling factor, the second circuit channel configured to generate a second output signal based on scaling an output of the second circuit block by a second output scaling factor, wherein the first circuit block and the second circuit block have a nonlinearity; and an output combiner configured to combine the two or more output signals including the first output signal and the second output signal to generate a combined output signal in which the nonlinearity is canceled, wherein the second circuit channel further includes one or more additional circuit blocks in parallel with the second circuit block, each of the one or more additional circuit blocks receiving the input signal scaled by the second input scaling factor.

10. The electronic system of claim 9, wherein the second circuit channel is further configured to generate the second output signal based on combining an output of each of the one or more additional circuit blocks with the output of the second circuit block.

11. The electronic system of claim 9, wherein the nonlinearity is a harmonic distortion component.

12. The electronic system of claim 9, further comprising a calibration circuit configured to calibrate the first output scaling factor based on a detected value of the first input scaling factor, and to calibrate the second output scaling factor based on a detected value of the second input scaling factor.

13. A method of nonlinearity cancellation, the method comprising:

processing an input signal in parallel using two or more circuit channels to generate two or more output signals, wherein processing the input signal includes:

scaling the input signal by a first input scaling factor to generate a first scaled input signal for a first circuit block of a first circuit channel;

generating a first output signal based on scaling an output of the first circuit block by a first output scaling factor;

scaling the input signal by a second input scaling factor to generate a second scaled input signal for a second circuit block of a second circuit channel;

generating a second output signal based on scaling an output of the second circuit block by a second output scaling factor, wherein the first circuit block and the second circuit block have a nonlinearity; and combining the two or more output signals including the first output signal and the second output signal using an output combiner to generate a combined output signal in which the nonlinearity is canceled, wherein a plurality of input scaling factors including the first input scaling factor and the second input scaling factor define a matrix, and wherein a plurality of output scaling factors including the first output scaling factor and the second output scaling factor are based on an inverse of the matrix.

14. The method of claim 13, further comprising:

scaling the input signal by a third input scaling factor to generate a third scaled input signal for a third circuit block of a third circuit channel; and generating a third output signal of the two or more output signals based on scaling an output of the third circuit block by a third output scaling factor.

15. The method of claim 13, wherein the first circuit block is a first analog-to-digital converter (ADC) and the second circuit block is a second ADC.

16. The method of claim 15, wherein the input signal is an analog or radio frequency signal and the combined output signal is a digital signal.

17. The method of claim 13, wherein the nonlinearity is a harmonic distortion component.

18. The method of claim 13, further comprising calibrating the first output scaling factor based on a detected value of the first input scaling factor and calibrating the second output scaling factor based on a detected value of the second input scaling factor.

19. The method of claim 13, wherein the second circuit channel further includes one or more additional circuit blocks in parallel with the second circuit block, the method further comprising providing each of the one or more additional circuit blocks the input signal scaled by the second input scaling factor, and generating the second output signal based on combining an output of each of the one or more additional circuit blocks with the output of the second circuit block.

20. The method of claim 13, wherein the second circuit block is a replica of the first circuit block.

* * * * *